US007339376B2

(12) United States Patent
Liu

(10) Patent No.: US 7,339,376 B2
(45) Date of Patent: Mar. 4, 2008

(54) MRI/MRS GRADIENT COIL WITH INTEGRATED COOLING CIRCUITS

(75) Inventor: Qin Liu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/279,107

(22) Filed: Apr. 9, 2006

(65) Prior Publication Data
US 2007/0236218 A1 Oct. 11, 2007

(51) Int. Cl.
*G01V 3/00* (2006.01)
(52) U.S. Cl. ................................... 324/318
(58) Field of Classification Search ........ 324/300–322; 600/410–435
See application file for complete search history.

(56) References Cited

U.S. PATENT DOCUMENTS

| 5,489,848 | A | * | 2/1996 | Furukawa | 324/318 |
| 5,581,185 | A | * | 12/1996 | Petropoulos et al. | 324/318 |
| 5,786,695 | A | | 7/1998 | Amor et al. | |
| 6,236,207 | B1 | * | 5/2001 | Arz et al. | 324/318 |
| 6,498,947 | B2 | * | 12/2002 | Boskamp et al. | 600/422 |
| 6,642,717 | B2 | * | 11/2003 | Dietz et al. | 324/318 |
| 6,667,619 | B2 | * | 12/2003 | Westphal et al. | 324/318 |
| 6,696,836 | B2 | * | 2/2004 | Kimmlingen | 324/309 |
| 6,741,152 | B1 | | 5/2004 | Arz et al. | |
| 6,774,631 | B2 | * | 8/2004 | Heid | 324/318 |
| 6,781,376 | B2 | * | 8/2004 | Schaaf | 324/318 |
| 6,977,501 | B2 | * | 12/2005 | Kassai et al. | 324/315 |
| 2001/0042385 | A1 | | 11/2001 | Kaindl et al. | |
| 2003/0222647 | A1 | | 12/2003 | Goldie | |

FOREIGN PATENT DOCUMENTS

| WO | 02/075345 A | 9/2002 |
| WO | 2005/043185 A | 5/2005 |
| WO | 2005279168 A | 10/2005 |

OTHER PUBLICATIONS

H.Lu et al., "Momentum-Weighted Conjugate Gradient Descent Algorithm for Gradient Coil Optimization" MAGN. Reson.Med., vol. 51, 2004, pp. 158-164, XP002442398, see the chapter 'Gradient Coil Design for Rat Imaging'.
Deka et al.: "Quantitative density profiling with pure phase encoding and a dedicated 1D gradient" Journal of Magnetic Resonance, Academic Press, Orlando, FL, US, vol. 178, No. 1, Jan. 2006, pp. 25-32, XP005197846 ISSN: 1090-7807 see chapter 3.1.
B. A. Chronik et al.: "A 2000mT/m Multilayer Gradient Coil for Mouse Imaging" Proc.Int.Soc.Mag.Reson.Med., 1999, p. 469, XP002442399 Conference abstract.
Leggett J et al.: "Actively shielded Multi—layer gradient coil designs with improved cooling properties" Journal of Magnetic Resonance, Academic Press, Orlando, FL, US, vol. 165, No. 2, Dec. 2003 (ZOO3-I2), pp. 196-207, XP004474985 ISSN: 1090-7807.

\* cited by examiner

*Primary Examiner*—Brij Shrivastav
*Assistant Examiner*—Dixomara Vargas
(74) *Attorney, Agent, or Firm*—Peter Vogel, Esq.; Michael G. Smith, Esq.

(57) ABSTRACT

Systems, methods and apparatus are provided through which heat produced in the patient examination space by the power used to create electromagnetic fields in an MRI/MRS system is significantly reduced by coolant carried by one of two split connected concentric coil layers of one of two of the primary gradient coils used to alter the main magnetic field. The coil carrying the coolant is made of copper tubing. The second primary gradient coil is placed between the layers of the split primary gradient coil. Adjusting the number of turns in each layer of the split primary gradient coil adjusts the heat generated. The inductances and resistances of the two primary gradient coils are balanced by adjusting the gain of the coils.

20 Claims, 4 Drawing Sheets

END-VIEW OF COIL PLACEMENT IN MRI/MRS CYLINDER

MRI/MRS SYSTEM COMPONENTS

PRIMARY COILS

END-VIEW OF COIL PLACEMENT IN MRI/MRS CYLINDER

MRI/MRS GRADIENT COIL WITH INTEGRATED COOLING CIRCUITS

FIELD OF THE INVENTION

This invention relates generally to Magnetic Resonance Imaging and Magnetic Resonance Spectroscopy devices, and more particularly to cooling systems, methods and apparatus for the gradient coils used in Magnetic Resonance Imaging and Magnetic Resonance Spectroscopy medical devices.

BACKGROUND OF THE INVENTION

The value of Magnetic Resonance Imaging (MRI) devices for medical use was recognized almost immediately after they first appeared in the 1970s. Because they appear both to do no harm to the human body, and to create better images of the body's interior than the best X-ray technology, they have gained widespread use for diagnosis, pre-operative examination and even for assistance during surgical procedures. While MRI provides information on size and location of pathological abnormalities such as tumors, a variation of magnetic resonance technology called Magnetic Resonance Spectroscopy (MRS)—which identifies various biochemicals and their concentrations—often can help further by providing more information on the tissue chemistry of the target abnormality.

The clinical use of MRI/MRS (Magnetic Resonance Imaging/Magnetic Resonance Spectroscopy) technology is based on detecting and interpreting radio frequency RF (Radio Frequency) electromagnetic excitation originating from target atomic nuclei in human tissue in response to manipulation of those nuclei with magnetic fields.

In the most common MRI configurations, a static main magnetic field is produced by a solenoid magnet apparatus, and arranged so that the cylindrical space bounded by the solenoid windings (i.e. the main magnet bore) forms a convenient space and platform for placement of an object—such as the human body—containing the target nuclei. The windings of the main field are super-cooled with liquid helium in order to reduce resistance, and, therefore, to minimize the amount of heat generated and the amount of power necessary to create and maintain the main field.

Gradient magnetic fields—typically three—make it possible to both enhance and manipulate the main field at locations determined by the purpose of the medical examination. Typically, the gradient fields are created by current passing through coiled saddle or solenoid windings, which are affixed to cylinders concentric with and fitted within a larger cylinder containing the windings of the main magnetic field.

Unlike the main magnetic field, coils used to create the gradient fields are not super-cooled, and, as a result, sometimes generate enough heat to create significant discomfort for the patient being examined. Any effort to reduce patient discomfort by placing cooling units within the walls of the cylinder between the patient and the gradient coils increases the distance between the patient and the coils that create the gradient fields, which reduces the efficiency of the gradient coil. A greater distance means a gradient coil will have higher resistance and inductance for a given coil gain (gradient strength per unit current) and for a given gradient field linearity, which results in higher heat generation and lower coil switching speed. If the coil gain or the linearity is reduced to maintain low resistance and inductance, the total gradient strength for a given current will be lower or the gradient field linearity will be poorer. The gradient strength and field linearity are of fundamental importance both to the accuracy of the details of the image produced and the information on tissue chemistry.

Increasing the current in the coils to improve the gradient strength at the greater distance not only increases power consumption raising the cost of operation of the MRI/MRS device, but defeats the purpose of the cooling units by increasing the heat generated by the coil.

For the reasons stated above, and for other reasons stated below which will become apparent to those skilled in the art upon reading and understanding the present specification, there is a need in the art for decreasing the heat experienced by the patient without compromising the clinical value of the gradient fields.

The above-mentioned shortcomings, disadvantages and problems are addressed herein, which will be understood by reading and studying the following specification.

SUMMARY OF THE INVENTION

In one aspect, an MRI/MRS system for medical examination includes a component which reduces the heat in the patient's examination space without compromising the efficiency of the gradient fields used to alter the main magnetic fields.

In another aspect, the component of the MRI/MRS system that reduces the heat experienced in the enclosed examination space from the power used to create the system's electromagnetic fields, is a split current-carrying coil of two connected layers containing coolant in one layer.

In another aspect, the two connected layers of the split current-carrying coil containing coolant in one layer are wound so as to collectively provide the desired magnetic field within the examination space.

In another aspect, the cooling effect of the split current-carrying coil of two connected layers containing coolant in one layer is altered by the number of turns in each of the two connected layers.

In a further aspect, coil gains are adjusted so as to balance the inductances and resistances of the split current-carrying coil of two connected layers containing coolant in one layer and the second current-carrying coil placed between the two layers of the split current-carrying coil containing coolant in at least one layer.

In another yet another aspect, the coils involved in the heat reducing component of the MRI/MRS system are gradient coils used to alter the main magnetic field along two orthogonal x and y axes within the examination space.

Apparatus, systems, and methods of varying scope are described herein. In addition to the aspects and advantages described in this summary, further aspects and advantages will become apparent by reference to the drawings and by reading the detailed description that follows.

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into five sections. In the first section, a system level overview is described. In the second section, apparatus of embodiments are described. In the third section, embodiments of methods are described. In the fourth section, a hardware and operating environment is described. Finally, in the fifth section, a conclusion of the detailed description is provided.

A typical clinical MRI/MRS procedure enables an examination which utilizes proton imaging or proton imaging combined with spectroscopy of other target nuclei that can improve the analysis of the chemistry of the tissue in question. Magnetic field primary gradient coils which make it possible to alter the value of the main magnetic field at any position along three orthogonal axes, thereby facilitating the targeting of any location in the subject patient's body also generate heat some of which is felt in the examination space containing the patient.

Apparatus and methods of an embodiment of the invention described herein reduces the heat in the examination space of an MRI/MRS system by splitting a primary gradient coils into two connected layers, one of which is to carry coolant in the coil layer nearest to the examination space while the other layer helps maintain the necessary primary gradient field.

System Level Overview

System 100 provides circuitry that maintains gradient coil field strength while reducing the heat to which the patient is subjected.

Figure 1:
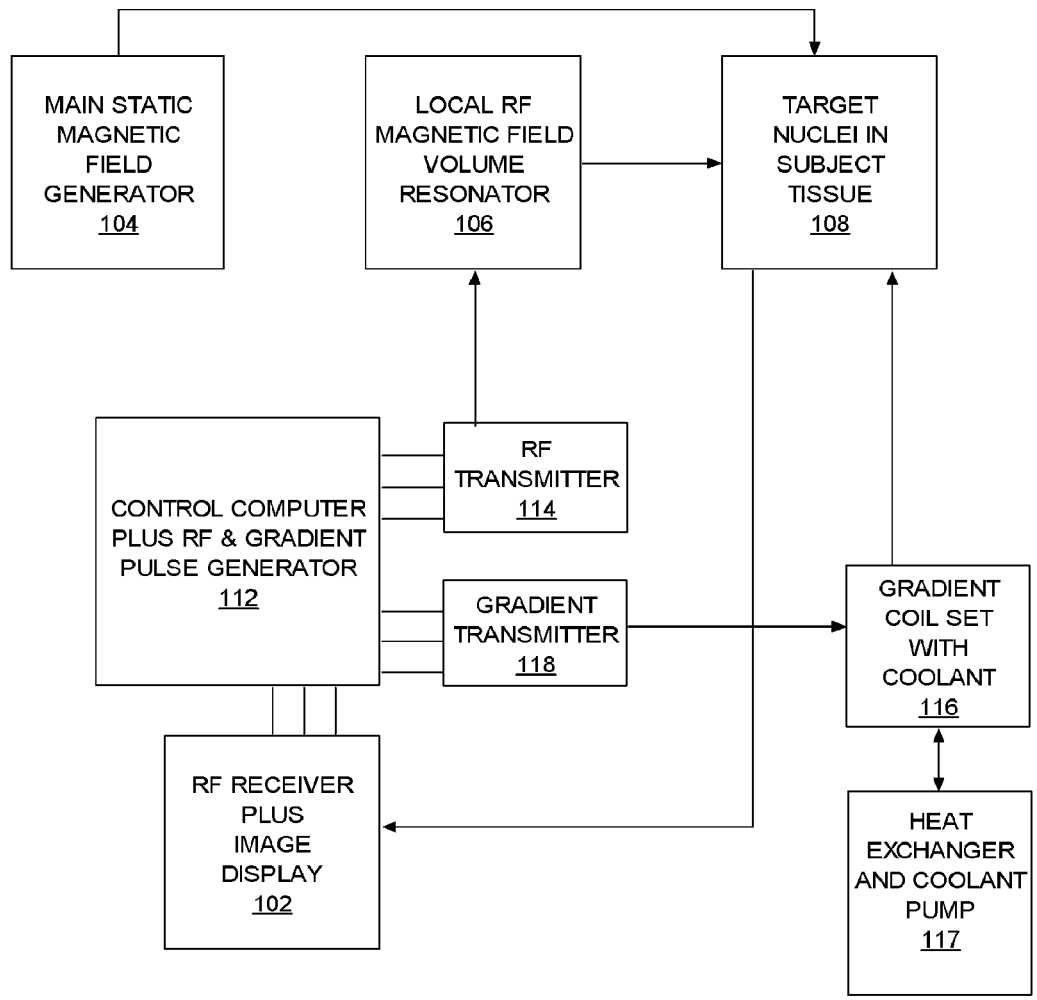
FIG. 1 is a block diagram of the components required for an MRI/MRS examination, including magnetic field generators, target nuclei, radio frequency circuitry, the control computer and gradient pulse generator, a gradient coil set, a heat exchanger and coolant pump for the gradient coil set and a device for image display. One embodiment of the control computer is described in FIG. 4.

In a clinical MRI/MRS examination using System 100 of FIG. 1, the main magnetic field generator 104 is applied, using the main field to disturb the magnetic orientation of the proton nuclei and using device 112 to generate Radio Frequency pulses to the local volume resonator magnetic field 106 via RF transmitter 114, and magnetic pulses to gradient coil set apparatus 116 using gradient transmitter 118 to perturb the magnetic orientation of target nuclei. This disturbance of the magnetic orientation of these target nuclei within the subject tissue produces characteristic RF signals from the target nuclei. The RF antennas receive these characteristic RF signals and send those same characteristic RF signals to the image display 102. Gradient coil set 116 is cooled by the coolant pump and heat exchanger 117.

A primary gradient coil split into two layers—one carrying coolant—in System 100's gradient coil set 116 solves the need in the art to reduce the heat to which the patient is subjected, and does so without compromising the clinical value of the magnetic field within the examination space. In this embodiment, gradient coil set 116 of system 100 separates the x-axis primary gradient coil into two layers of connected coils separated by the primary gradient y-axis coil. The layer of the x-axis primary gradient coil which is closest radially to the patient includes coolant in a channel within the coil.

Figure 2:
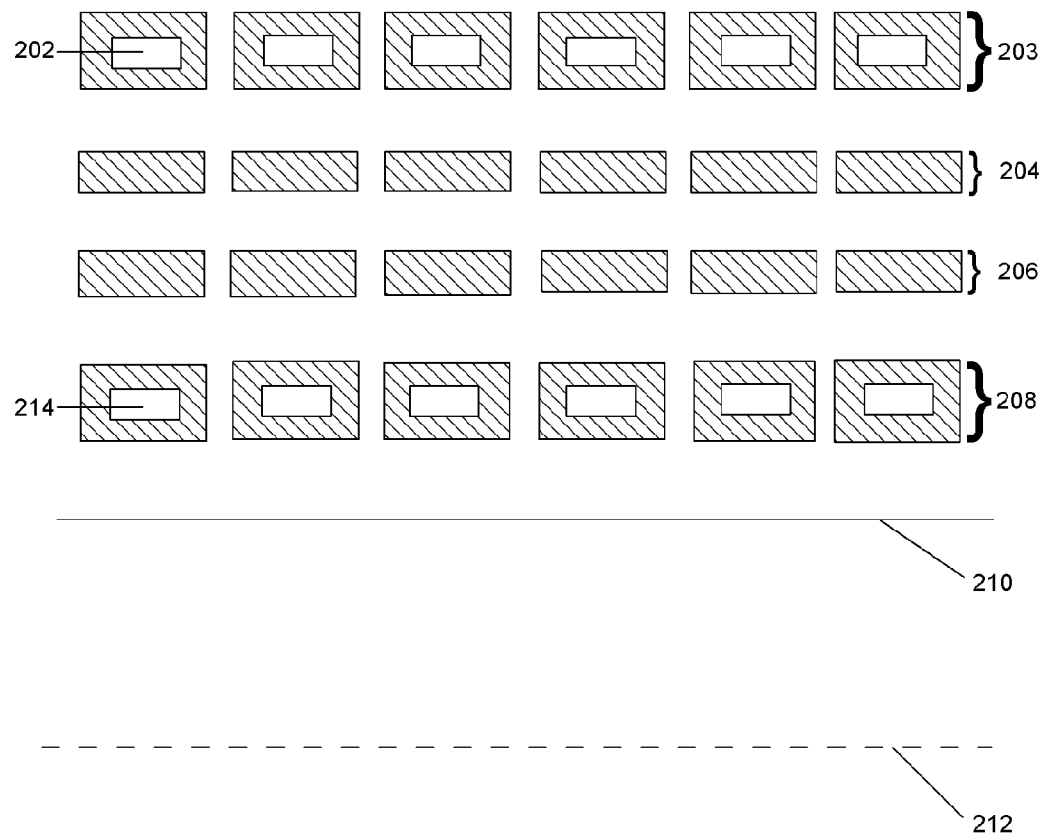
FIG. 2 is a partial cross-sectional drawing of an MRI/MRS cylinder. The figure shows the center-line of the MRI/MRS cylinder and the primary magnetic gradient coils in a shielded gradient coil set—with the y-axis primary gradient coil located radially between the two coils which together make-up the x-axis primary gradient coil; both the y-axis primary gradient coil and the x-axis primary gradient coil (which is made-up of the two coils that radially surround the y-axis primary gradient coil) are surrounded by the z-axis primary gradient coil.
Figure 3:
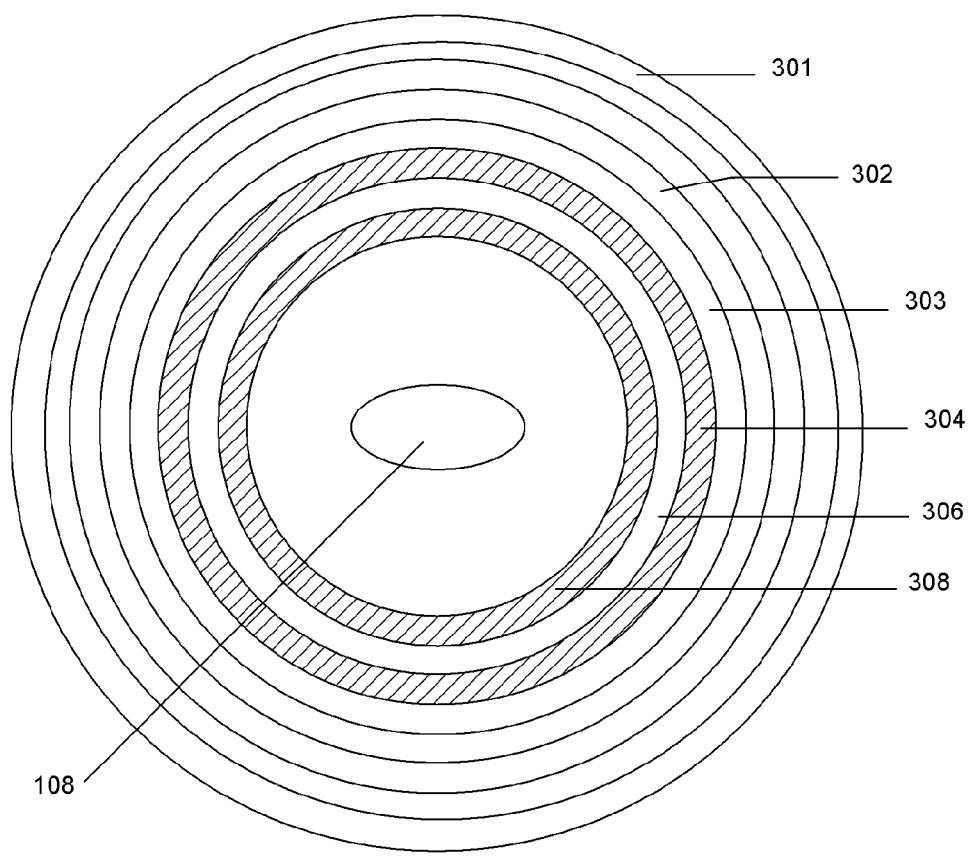
FIG. 3 is a drawing of an end view of the MRI/MRS cylinder showing the patient in the center of the cylinder surrounded by x, y and z axes primary gradient coils, which are surrounded by the x, y and z axes shielding coils, and all is surrounded by the main magnetic field coil. For simplicity, RF circuitry is not shown, nor are radial spaces between coil cylinders shown.

Gradient coil set 116 and its circuitry are seen in FIGS. 2-3, and discussed below.

System 100 is not limited to using only one particular gradient coil configuration in gradient coil set 116, as will be understood through the following discussion.

Apparatus Embodiments

In the previous section, a system level overview of the operation of an embodiment was described. In this section, the particular cooling apparatus of such an embodiment is described by reference to a series of diagrams.

Gradient coil set 116 solves the need in the art to reduce the discomfort felt by the patient in the examination space from the heat generated by the gradient coils without compromising the ability of the magnetic coils to alter the magnetic field at any place in the body of the patient.

The manner in which the coils are mounted in MRI/MRS devices is well-known, but will be described briefly for completeness. The primary gradient coils are affixed to a cylinder, which is contained within another cylinder to which are affixed the secondary gradient coils which shield other structures from the magnetic fields generated by the primary gradient coils. Both cylinders are surrounded by the cylinder containing the main magnetic field coil. There are three primary gradient coils, one for each of three orthogonal axes, designated, x, y and z, which make it possible to adjust the main magnetic field at any location of the patient's body.

In the conventional configuration, the coil radially closest to the patient is the x-axis primary gradient coil, followed radially by the y-axis primary gradient coil, then the z-axis primary gradient coil. Each primary gradient coil has a corresponding secondary (shielding) gradient coil to shield surrounding structures from the magnetic field generated by the primary gradient coil. Each of the primary gradient coils and each of the shielding coils is at a different radial distance from the patient than is any other coil. Each gradient coil covers the cylinder on which it is mounted and is typically made up of four saddle windings as illustrated in Goldie, U.S. Patent Publication Number U.S. 2003/0222647 A1; Publication Date, Dec. 4, 2003. The main field coil radially surrounds both the primary and the secondary gradient coils.

Splitting the x-axis primary coil into two layers, using coolant- and current-carrying copper tubing for the innermost layer of the x-axis primary gradient coil, and placing the y-axis primary gradient coil between the layers of the x-axis primary gradient coil provides improved temperature control in the examining space, allows the use of larger coolant- and current-carrying copper tubing than would be possible with only a single layer of coil for the x-axis primary gradient coil, and allows for the balanced performance of the x-axis primary gradient coil and the y-axis primary gradient coil.

In this embodiment, gradient coil set 116 includes the x-axis primary gradient coil split into two series-connected layers, surrounding the y-axis primary gradient coil. The innermost portion of the x-axis primary gradient coil, coil layer 308—which is the x-axis coil layer that is radially closer to the patient than the y-axis primary gradient coil 306—is constructed of copper tubing, which has a central channel 214 sufficiently large in cross-sectional area to carry an amount of coolant adequate for significantly reducing the heat within the examination space. The outermost layer of the x-axis primary gradient coil carries no coolant. The function of the outermost coil layer of the x-axis primary coil is to compensate for the strength of the gradient field that would be lost by increasing the cross-sectional dimensions of the inner layer of the x-axis primary coil so as to allow the inner layer of the x-axis to carry coolant.

Since the cylindrical area covered by any of the coils cannot be increased without changing the dimensions of the entire examination cylinder, and because the primary gradient coils already are normally tightly wound, the use of copper tubing sufficiently large in cross-section to carry adequate coolant generally does not, itself, have enough turns to create the desired x-axis primary gradient. But the x-axis primary gradient provided by the coolant-carrying copper tubing of coil layer 308 is supplemented by a second layer 304 of x-axis coil connected in series with the copper tubing coil 308 with the y-axis primary gradient coil 306 located radially between the coil layers 304 and 308 comprising the x-axis primary gradient coil. The winding of the second layer of the x-axis coil, coil layer 304 is composed not of copper tubing but of solid copper sheet in this illustrative embodiment. The z-axis primary gradient coil lies radially beyond the outer layer of the x-axis primary gradient coil, and itself typically carries coolant.

The number of turns in the windings of the two coil layers 304 and 308 which together make up the x-axis primary gradient coil need not be the same. The distribution of turns between the two coil layers 304 and 308 is affected by the need to set the sum of the coil gains of the two coil layers 304 and 308 equal to the desired coil gain of the x-axis primary gradient coil. And, since the distribution of turns between the two coil layers 304 and 308 which together make up the x-axis primary gradient coil affects the inductance and resistance of the primary gradient coil, the balance between the inductances and resistances of the x-axis primary gradient coil and the y-axis primary gradient coil to maintain the desired coil gains—i.e. the gradient strength per unit of current—are achieved by placing the y-axis primary gradient coil 306 between the two coil layers 304 and 308 of the x-axis primary gradient coil and by adjusting the distribution of turns between the two layers 304 and 306 of the x-axis primary gradient coil.

Furthermore, in another aspect of the embodiment, adjusting the distribution of turns between the two coil layers 304 and 308 which together make up the x-axis primary gradient coil also adjusts the cooling effect in the examination space, since a greater number of turns in the coolant-carrying coil layer 308 places more coolant in maximum proximity to the current-carrying heat source closest to the examination space.

FIG. 2 is a partial cross-sectional drawing of the primary gradient coil cylinder. In addition to the coolant channel 214 for the innermost coil layer 208 of the x-axis primary gradient coil, the figure shows the inner boundary 210 of the primary gradient coil cylinder, the center-line 212 of the gradient coil cylinder and the primary gradient coils—with the y-axis primary gradient coil 206 located radially between the two coil layers 204 and 208 which together are the x-axis primary gradient coil. Both the y-axis primary gradient coil 206 and the x-axis primary gradient coil (which includes the two coil layers 204 and 208, which together form the x-axis primary gradient coil and radially surround the y-axis primary gradient coil) are surrounded by the z-axis primary gradient coil 203, which, conventionally, carries coolant in channel 202.

The configuration of the coils in this embodiment of the invention includes an x-axis primary gradient coil made up of two connected coils separated radially by the y-axis primary gradient coil. This is illustrated in both FIG. 2 and FIG. 3. FIG. 3 is a drawing of an end view of the MRI/MRS cylinders showing the patient 108 in the center of the MRI/MRS device, surrounded by the two coil layers 304 and 308 which together make up the x-axis primary gradient coil and radially surround the y-axis primary gradient coil 306. The x-axis and y-axis primary gradient coils are surrounded radially by the z-axis primary gradient coil 303, and all of the primary gradient coils are then surrounded radially by the x, y and z axes shielding secondary gradient coils 302, and all is surrounded radially by the main magnetic field coil 301.

The primary gradient coil for the y axis includes four connected saddle windings, two of which are draped side-by-side lengthwise across half of a cylinder while both of the other saddle windings are mounted lengthwise on the other half of the cylinder at about 180 degrees to the first two. Similarly, in primary gradient coil cylinder 300 each of the connected coil layers 304 and 308 of the x-axis primary gradient coil also is made-up of four saddle windings, two of which are—in effect—draped side-by-side lengthwise across half of a cylinder while both of the other two saddle windings are mounted on the other half of the cylinder at about 180 degrees to the first two.

As seen in FIGS. 2 and 3, the mountings of the x and y primary gradient coils are concentric both with each other and with the cylinders on which the z axis primary coil, the shielding coils and the main magnetic coil are mounted.

In another embodiment, the y-axis primary gradient coil is split into two layers surrounding a single x-axis primary gradient coil. The inner layer of the y-axis primary gradient coil is made of coolant- and current-carrying copper tubing, and the outer layer of the y-axis primary gradient coil is made either of copper sheet or copper wire.

The invention is not limited by the geometry of the gradient coil system. In another embodiment, a system with bi-planar, rather than cylinder-mounted gradient coils is used. Nor is the invention limited to gradient coils.

In another embodiment, the outer layer of the x-axis gradient coil is made of copper wire.

In yet another embodiment, the outer layer of the x-axis gradient coil also is made of coolant- and current-carrying copper tubing, rather than copper sheet.

Hardware and Operating Environment

Figure 4:
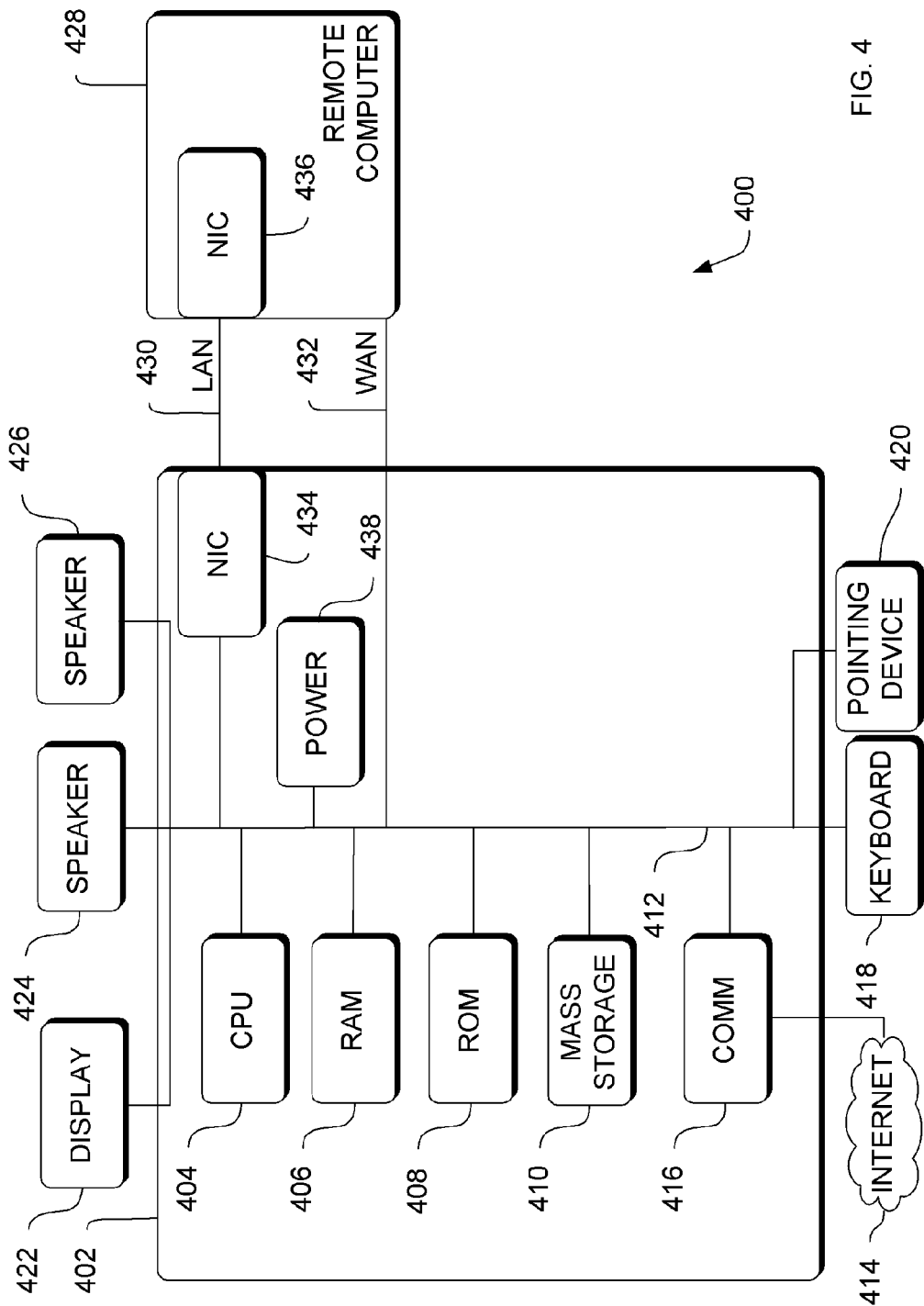
FIG. 4 is a block diagram of the hardware and operating environment in which different embodiments can be practiced.

FIG. 4 is a block diagram of the hardware and operating environment 400 in which different embodiments can be practiced. The description of FIG. 4 provides an overview of computer hardware and a suitable computing environment in conjunction with which some embodiments can be implemented. Embodiments are described in terms of a computer executing computer-executable instructions. However, some embodiments can be implemented entirely in computer hardware in which the computer-executable instructions are implemented in read-only memory. Some embodiments can also be implemented in client/server computing environments where remote devices that perform tasks are linked through a communications network. Program modules can be located in both local and remote memory storage devices in a distributed computing environment.

Computer 402 includes a processor 404, commercially available from Intel, Motorola, Cyrix and others. Computer 402 also includes random-access memory (RAM) 406, read-only memory (ROM) 408, and one or more mass storage devices 410, and a system bus 412, that operatively couples various system components to the processing unit 404. The memory 406, 408, and mass storage devices, 410, are types of computer-accessible media. Mass storage devices 410 are more specifically types of nonvolatile computer-accessible media and can include one or more hard disk drives, floppy disk drives, optical disk drives, and tape cartridge drives. The processor 404 executes computer programs stored on the computer-accessible media.

Computer 402 can be communicatively connected to the Internet 414 via a communication device 416. Internet 414 connectivity is well known within the art. In one embodiment, a communication device 416 is a modem that responds to communication drivers to connect to the Internet via what is known in the art as a "dial-up connection." In another embodiment, a communication device 416 is an Ethernet® or similar hardware network card connected to a local-area network (LAN) that itself is connected to the Internet via what is known in the art as a "direct connection" (e.g., T1 line, etc.).

A user enters commands and information into the computer 402 through input devices such as a keyboard 418 or a pointing device 420. The keyboard 418 permits entry of textual information into computer 402, as known within the art, and embodiments are not limited to any particular type of keyboard. Pointing device 420 permits the control of the screen pointer provided by a graphical user interface (GUI) of operating systems such as versions of Microsoft Windows®. Embodiments are not limited to any particular pointing device 420. Such pointing devices include mice, touch pads, trackballs, remote controls and point sticks. Other input devices (not shown) can include a microphone, joystick, game pad, satellite dish, scanner, or the like.

In some embodiments, computer 402 is operatively coupled to a display device 422. Display device 422 is connected to the system bus 412. Display device 422 permits the display of information, including computer, video and other information, for viewing by a user of the computer. Embodiments are not limited to any particular display device 422. Such display devices include cathode ray tube (CRT) displays (monitors), as well as flat panel displays such as liquid crystal displays (LCD's). In addition to a monitor, computers typically include other peripheral input/output devices such as printers (not shown). Speakers 424 and 426 provide audio output of signals. Speakers 424 and 426 are also connected to the system bus 412.

Computer 402 also includes an operating system (not shown) that is stored on the computer-accessible media RAM 406, ROM 408, and mass storage device 410, and is and executed by the processor 404. Examples of operating systems include Microsoft Windows®, Apple MacOS®, Linux®, UNIX®. Examples are not limited to any particular operating system, however, and the construction and use of such operating systems are well known within the art.

Embodiments of computer 402 are not limited to any type of computer 402. In varying embodiments, computer 402 comprises a PC-compatible computer, a MacOS®-compatible computer, a Linux®-compatible computer, or a UNIX®-compatible computer. The construction and operation of such computers are well known within the art.

Computer 402 can be operated using at least one operating system to provide a graphical user interface (GUI) including a user-controllable pointer. Computer 402 can have at least one web browser application program executing within at least one operating system, to permit users of computer 402 to access an intranet, extranet or Internet world-wide-web pages as addressed by Universal Resource Locator (URL) addresses. Examples of browser application programs include Netscape Navigator® and Microsoft Internet Explorer®.

The computer 402 can operate in a networked environment using logical connections to one or more remote computers, such as remote computer 428. These logical connections are achieved by a communication device coupled to, or a part of, the computer 402. Embodiments are not limited to a particular type of communications device. The remote computer 428 can be another computer, a server, a router, a network PC, a client, a peer device or other common network node. The logical connections depicted in FIG. 4 include a local-area network (LAN) 430 and a wide-area network (WAN) 432. Such networking environments are commonplace in offices, enterprise-wide computer networks, intranets, extranets and the Internet.

When used in a LAN-networking environment, the computer 402 and remote computer 428 are connected to the local network 430 through network interfaces or adapters 434, which is one type of communications device 416. Remote computer 428 also includes a network device 436. When used in a conventional WAN-networking environment, the computer 402 and remote computer 428 communicate with a WAN 432 through modems (not shown). The modem, which can be internal or external, is connected to the system bus 412. In a networked environment, program modules depicted relative to the computer 402, or portions thereof, can be stored in the remote computer 428.

Computer 402 also includes power supply 438. Each power supply can be a battery.

CONCLUSION

An apparatus, system and method is described for reducing the heat in the MRI/MRS examination space generated by the power dissipated by the gradient coils. Although specific embodiments are illustrated and described herein, it will be appreciated by those of ordinary skill in the art that any arrangement which is calculated to achieve the same purpose may be substituted for the specific embodiments shown. This application is intended to cover any adaptations or variations. For example, although described in terms of MRI/MRS equipment, one of ordinary skill in the art will appreciate that implementations can be made in other devices that provide the required function.

In particular, it should be appreciated that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future MRI/MRS devices.

The terminology used in this application with respect to the apparatus of MRI/MRS devices is meant to include all environments and alternate technologies which provide the same functionality as described herein.

I claim:

1. An apparatus to reduce heat dissipated into a space by current-carrying coils, the apparatus comprising:
   at least one x-axis current-carrying coil that is split into two or more connected layers containing coolant in at least one of the layers; and
   a second y-axis current-carrying coil placed between two layers of the at least one x-axis current-carrying coil;
   a z-axis primary gradient coil surrounding both of the two or more connected layers of the at least one x-axis current-carrying coil, and
   wherein the windings of the two or more connected layers of the at least one x-axis current-carrying coil are configured so that together the two or more connected layers can create the magnetic field of the at least one x-axis current carrying coil.

2. The apparatus of claim 1 wherein the layers of the at least one x-axis current-carrying coil are mounted on concentric cylinders.

3. The apparatus of claim 1 wherein the layers of the at least one x-axis current-carrying coil and a second y-axis current-carrying coil placed between the layers of the at least one current-carrying x-axis coil are mounted on cylinders concentric with the cylinder on which the coil of the main magnetic field is mounted.

4. The apparatus of claim 1 wherein the electromagnetic fields are generated by coils of a magnetic resonance imaging/magnetic resonance spectroscopy system.

5. The apparatus of claim 1, wherein the coils are primary gradient coils of a magnetic resonance imaging/magnetic resonance spectroscopy system.

6. The apparatus of claim 1 wherein the space is the examination space designed to contain the patient in a magnetic resonance imaging/magnetic resonance spectroscopy system.

7. The apparatus of claim 1, wherein the at least one layer containing coolant in the at least one x-axis current-carrying coil further comprises a copper tube winding.

8. The apparatus of claim 1, wherein the one or more layers that do not carry coolant in the at least one current-carrying x-axis coil further comprise copper sheet.

9. The apparatus of claim 1, wherein one layer containing coolant in the at least one x-axis current-carrying coil is the layer closest to the examining space.

10. The apparatus of claim 1, wherein one layer containing coolant in the at least one x-axis current-carrying coil is not the layer closest to the examining space.

11. The apparatus of claim 1 wherein the two or more connected layers of the at least one x-axis current-carrying coil further comprise two connected layers of the at least one x-axis current-carrying coil.

12. The apparatus of claim 1 wherein the at least one x-axis current-carrying coil is a primary gradient coil of a magnetic resonance imaging/magnetic resonance spectroscopy device.

13. The apparatus of claim 1 wherein the at least one y-axis current-carrying coil is a primary gradient coil of a magnetic resonance imaging/magnetic resonance spectroscopy device.

14. The apparatus of claim 13 wherein the at least one x-axis current-carrying coil is a primary gradient coil of the magnetic resonance imaging/magnetic resonance spectroscopy device.

15. The apparatus of claim 14 wherein the coils include biplanar gradient coils.

16. The apparatus of claim 1, wherein the apparatus is not a component of a magnetic resonance imaging/magnetic resonance spectroscopy system.

17. The apparatus of claim 1 wherein the coils include biplanar gradient coils.

18. A magnetic resonance imaging/magnetic resonance spectroscopy system, the system including as a component the apparatus of claim 1, wherein the at least one current-carrying coil is at least one primary gradient coil of the magnetic resonance imaging/magnetic resonance spectroscopy system.

19. A method comprising adjusting efficiencies in an magnetic resonance imaging/magnetic resonance spectroscopy device of layers in an x-axis current-carrying coil that is split into two connected layers containing coolant in at least one of the layers so as to balance the inductances and resistances of the current-carrying coil split into two connected layers and a second y-axis current-carrying coil placed between the two layers of the x-axis current-carrying coil, wherein a z-axis primary gradient coil surrounds both of the two or more connected layers of the x-axis current-carrying coil and the z-axis primary gradient coil surround the y-axis primary gradient coil.

20. A method comprising adjusting a cooling effect in an magnetic resonance imaging/magnetic resonance spectroscopy device of an x-axis current-carrying coil that is split into two connected layers containing coolant in one layer is achieved by adjusting the number of turns in each of the two connected layers of the x-axis current-carrying coil split into two connected layers containing coolant in one layer, the x-axis current-carrying coil having a second y-axis current-carrying coil placed between two layers of the split x-axis current-carrying coil, wherein the x-axis current-carrying coil is a primary gradient coil of the magnetic resonance imaging/magnetic resonance spectroscopy device and the y-axis current-carrying coil is a primary gradient coil of the magnetic resonance imaging/magnetic resonance spectroscopy device, wherein a z-axis primary gradient coil surrounds both of the two or more connected layers of the x-axis current-carrying coil.

* * * * *